(12) United States Patent
Carlborg et al.

(10) Patent No.: US 11,143,959 B2
(45) Date of Patent: Oct. 12, 2021

(54) METHOD FOR MAKING THREE DIMENSIONAL STRUCTURES USING PHOTOLITHOGRAPHY AND AN ADHESIVELY BONDABLE MATERIAL

(71) Applicant: Mercene Labs AB, Stockholm (SE)

(72) Inventors: Carl Fredrik Carlborg, Stockholm (SE); Tommy Haraldsson, Järfälla (SE); Henrik Mikaelsson, Bandhagen (SE); Noriyuki Masuda, Tokyo (JP)

(73) Assignee: MERCENE LABS AB, Stockholm (SE)

(*) Notice: Subject to any disclaimer, the term of this patent is extended or adjusted under 35 U.S.C. 154(b) by 94 days.

(21) Appl. No.: 16/327,769

(22) PCT Filed: Aug. 24, 2017

(86) PCT No.: PCT/EP2017/071313
§ 371 (c)(1),
(2) Date: Feb. 22, 2019

(87) PCT Pub. No.: WO2018/037071
PCT Pub. Date: Mar. 1, 2018

(65) Prior Publication Data
US 2019/0227434 A1     Jul. 25, 2019

(30) Foreign Application Priority Data

Aug. 25, 2016  (SE) .................... 1651150-3

(51) Int. Cl.
*C09J 5/02* (2006.01)
*G03F 7/038* (2006.01)
(Continued)

(52) U.S. Cl.
CPC .......... *G03F 7/038* (2013.01); *B81C 1/00071* (2013.01); *B81C 3/001* (2013.01);
(Continued)

(58) Field of Classification Search
CPC ...................... C09J 2463/00; C09J 2301/416; C09J 163/00; C09J 5/02; G03F 7/405;
(Continued)

(56) References Cited

U.S. PATENT DOCUMENTS 4,943,516 A       7/1990  Kamayachi et al.
2011/0030874 A1   2/2011  Lao

FOREIGN PATENT DOCUMENTS

CN    1033389 A     6/1989
CN    103221458 A   7/2013
(Continued)

OTHER PUBLICATIONS

Vastesson et al. "Robust Microdevice Manufacturing by Direct Lithogrpahy and Adhesive-Free Bonding of Off-Stoichiometry Thiol-Ene-Epoxy (OSTE+) Polymer." (Year: 2013).*
(Continued)

*Primary Examiner* — Daniel McNally
(74) *Attorney, Agent, or Firm* — Porter Wright Morris & Arthur LLP

(57) ABSTRACT

A method for making three dimensional structures using photolithography and an adhesively bondable material is disclosed. A thiol-ene-epoxy (OSTE(−)) material undergoes a first reaction upon partial irradiation in a pattern to become a partially cross-linked polymer network. Non-cross-linked parts are dissolved in a solvent and removed. An initiator is added to activate the cross-linked polymer network so that it becomes adhesive and can then be covalently bound to another object to form an article. The method can be utilized to manufacture an article with a complicated three dimensional shape in an easy way.

23 Claims, 3 Drawing Sheets

(51) Int. Cl.

| | |
|---|---|
| *C08G 59/40* | (2006.01) |
| *C09D 163/00* | (2006.01) |
| *C08G 75/045* | (2016.01) |
| *G03F 7/16* | (2006.01) |
| *G03F 7/20* | (2006.01) |
| *G03F 7/32* | (2006.01) |
| *G03F 7/40* | (2006.01) |
| *C09J 163/00* | (2006.01) |
| *B81C 3/00* | (2006.01) |
| *C09J 5/00* | (2006.01) |
| *B81C 1/00* | (2006.01) |

(52) U.S. Cl.
CPC ....... *C08G 59/4064* (2013.01); *C08G 75/045* (2013.01); *C09D 163/00* (2013.01); *C09J 5/00* (2013.01); *C09J 5/02* (2013.01); *C09J 163/00* (2013.01); *G03F 7/0385* (2013.01); *G03F 7/16* (2013.01); *G03F 7/162* (2013.01); *G03F 7/168* (2013.01); *G03F 7/2014* (2013.01); *G03F 7/325* (2013.01); *G03F 7/405* (2013.01); *B81C 2201/0157* (2013.01); *B81C 2203/032* (2013.01); *C09J 2301/416* (2020.08); *C09J 2463/00* (2013.01)

(58) Field of Classification Search
CPC ........ G03F 7/2014; G03F 7/168; G03F 7/162; G03F 7/0385; G03F 7/038; B81C 3/001
See application file for complete search history.

(56) References Cited

FOREIGN PATENT DOCUMENTS

| | | |
|---|---|---|
| EP | 1295846 A1 | 3/2003 |
| JP | 2009134255 A | 6/2009 |
| WO | 2012/042059 A2 | 4/2012 |
| WO | 2013/167576 A2 | 11/2013 |

OTHER PUBLICATIONS

"Robust Microdevice Manufacturing by Direct Lithography and Adhesive-Free Bonding of Off-Stoichiometry Thiol-ene-epoxy (OTSE+) Polymer," Vatesson et al., Jun. 2013. (Year: 2013).*
Vastesson et al., Robust Microdevice Manufacturing by Direct Lithography and Adhesive-Free Bonding of Off-Stoichiometry Thiol-Ene-Epoxy (OSTE+) Polymer, Transducers, pp. 408-411 (Jun. 16, 2013).
Saharil et al., Dry adhesive bonding of nanoporous inorganic membranes to microfluidic devices using the OSTE(+) dual-cure polymer, Journal of Micromechanics and Microengineering, vol. 23, 025021 ( 8 pp) (2013).
Pardon et al., Rapid mold-free manufacturing of microfluidic devices with robust and spatially directed surface modifications, Microfluid Nanofluid, vol. 17, pp. 773-779 (2014).
Saharil et al., Superior Dry Bonding of Off-Stoichiometry Thiol-Ene Epoxy (OSTE(+)) Polymers for Heterogeneous Material Labs-on-Chip, 16th International Conference on Miniaturized Systems for Chemistry and Life Sciences, pp. 1831-1833 (Oct. 28-Nov. 1, 2012).
Carioscia et al., Evaluation and control of thiol-ene/thiol-epoxy hybrid networks, Polymer, vol. 48, pp. 1526-1532 (2007).

* cited by examiner

METHOD FOR MAKING THREE DIMENSIONAL STRUCTURES USING PHOTOLITHOGRAPHY AND AN ADHESIVELY BONDABLE MATERIAL

TECHNICAL FIELD

The present invention relates generally to a method of manufacturing an article involving a first curing of selected parts of a material, dissolution of non-cured material and further chemical reactions to bond the material to another object to create the item.

BACKGROUND

Photolithographic methods are widespread within the fields of electronics, medical devices and manufacturing of micro devices containing biological reagents such as e.g. proteins. It enables the manufacturing of any pattern in two dimensions. With current state of the art, the choice in the third dimension is only the thickness of the applied polymer layer. If a true three dimensional structure should be obtained, the photolithography pattern must be assembled with another structure using an adhesive. This is also true for the simplest case where a flat lid is attached to seal the pattern. There is an obvious risk that the fine structures such patterns can be filled and thus destroyed by the application of an external adhesive. Currently other existing bonding technologies for photoresist structures involve process temperatures above 100° C. The maximum allowable temperature for biological materials is 42° C. This limits the development of three dimensional structures made from photolithography patterns for use in applications requiring biological reagents in the microstructure. To preserve the biological reagents, solutions using external adhesives have to be used. Such methods cannot be used on a micro sized structure. The chips are thus larger than otherwise necessary, and the packaging operation has to be performed for each individual chip.

WO 2012/042059 discloses a method for the manufacture of articles of thiolene polymers comprising the steps: a) reacting a compound comprising at least two thiol groups and a compound comprising at least two carbon-carbon double bonds, in off stoichiometry ratios to obtain a first intermediate article, wherein said first intermediate article comprises at least one unreacted group selected from an unreacted thiol group and an unreacted carbon-carbon double bond, and b) contacting said first intermediate article with a second article, wherein the surface of said second article at least partially comprises reactive groups and reacting at least a part of said unreacted groups on said first intermediate article with chemical groups on said second article to obtain covalent bonds and forming a final article.

WO 2013/167576 discloses a primer coating for the use with polymeric coating systems for materials, where the primer retains reactivity for a period of time after a first curing process is completed.

VASTESSON, A. et al. in Robust microdevice manufacturing by direct lithography and adhesive-free bonding of off-stochiometry thiol-ene-epoxy (OSTE+) polymer In: 2013 Transducers & Eurosensors XXVII: The 17th International Conference on Solid-State Sensors, Actuators & Microsystems, 2013, pp. 408-411 disclose patterning of a material based on thiol-ene-epoxi to manufacture different layers that can be joined to one substrate. The material is joined in two steps including an UV-step. The UV curing/activation in the initiation of a chemical reaction is a drawback since sensitive molecules may be damaged by the UV radiation. Examples of such molecules include biological molecules such as proteins, DNA, as well as entire cells and parts of cells. The material I D1 is a liquid until it has been cured.

US2011030874 discloses a method of bonding two substrates where both substrates have a surface covered by epoxy resin. The method can be used for temperature sensitive molecules. The method comprises heating to an elevated temperature of 20-50° C.

The prior art based on OSTE have two major problems. A liquid photoresist is not possible to use in contact lithography since the UV-cured resist will adhere to the mask, with destruction of the resist film and the mask as result. Contact lithography is often preferred over proximity lithography since the proximity process is more complicated and gives poorer resolution. A resist which is solid after solvent evaporation but have the basic dual cure properties of the material described in WO 2012/042059 will enable contact lithography and low temperature bonding.

The other problem is extraction of the second cure resin during the lithography development process. The solvent used to dissolve the uncured parts of the pattern may also extract the so far uncured resin intended for the second cure step, with a risk of bad adhesion in the bonding step.

SUMMARY

It is an object of the present invention to obviate at least some of the disadvantages in the prior art and provide an improved method of manufacturing an article, where two or more objects are joined to form the article.

This and other objects is achieved in this invention by using a resin which is solid at room temperature, making the whole formulation solid before the exposure step.

This and other objects is also solved by partially modifying the second cure resin so it has an ability to react with the first stage cure resin. In this way it will be chemically bonded to the first stage cure network after the UV exposure and will not risk being extracted during the development process. There will still be second stage cure groups which can be active during the bonding step.

The current invention overcomes problems with prior art, it allows for contact lithography for the production of microstructure and bonding of very fine microstructures below the temperature limit 42° C. for the packaging of structures containing biological reagents or other temperature sensitive materials. It is an advantage that the temperature can be kept below 42° C. during the entire process to protect sensitive materials. When temperature sensitive molecules are not present the temperature can be higher for other parts of the process, for instance when evaporating solvents and so on. When temperature sensitive molecules are present this can be performed at lower temperature. These combined features make it possible to manufacture biochips on wafer scale. Instead of manufacture one chip at the time, several hundred chips can be prepared, spotted with reagents and packaged on one silicone or glass wafer which is then diced into fully functioning chips. In this way truly micro sized chips can be made at a much lower cost compared to today's technologies.

In a first aspect there is provided a method for manufacturing an article comprising the steps of:
   a) providing a material which is solid at room temperature (102) wherein said material (102) is soluble in an organic solvent (107), wherein the material (102) comprises at least one selected from the group consisting of i) an epoxy resin with unsaturated carbon-carbon bonds and ii) an epoxy resin with a molecular weight over 400, preferably over 600, wherein the material (102) comprises monomers comprising at least two thiol groups, monomers comprising at least two carbon-carbon unsaturated bonds, and a first initiator capable of initiating the chemical reaction to form a cross-linked polymer network (106) when the material (102) is exposed to actinic radiation in a first activation step and wherein said material (102) can undergo a chemical reaction to form a cross-linked polymer network (106) when the material (102) is exposed to actinic radiation in the first activation step, b) at least partially exposing said material (102) to actinic radiation (104) adapted to initiate a reaction to form a cross-linked polymer network (106) in the first activation step, wherein said exposure is made in a pattern, wherein the cross-linked polymer network (106) is not soluble in the organic solvent (107), c) dissolving non-cross-linked material in an organic solvent (107) so that the cross-linked polymer network (106) remains, d) contacting the cross-linked polymer network (106) with a second initiator in a second activation step to initiate a further reaction to create further cross links and adhesive properties to obtain an activated cross-linked polymer network, e) contacting the activated cross-linked polymer network with another object (108) so that they become bonded forming the article.

In one embodiment the material 102 comprises a polymer. In one embodiment the material comprises monomers comprising at least two thiol groups, monomers comprising at least two carbon-carbon unsaturated bonds, and a first initiator capable of imitating a polymerization reaction upon irradiation with actinic light. The first initiator is capable of initiating the chemical reaction to form a cross-linked polymer network (106) when the material (102) is exposed to actinic radiation in the first activation step.

In one embodiment the material comprises an epoxy resin. In one embodiment the material comprises an epoxy resin with unsaturated carbon-carbon bonds.

In one embodiment the first initiator is an UV initiator. In one embodiment the first initiator is an initiator working with a longer wavelength in order to avoid UV-radiation for sensitive molecules.

In one embodiment the material in step a) first is dissolved in an organic solvent, and wherein said organic solvent subsequently is evaporated before step b). In one embodiment the organic solvent is evaporated using at least one selected from the group consisting of vacuum and heat. In one embodiment the material is applied on a substrate as a film.

In one embodiment the substrate is treated with a primer before step a).

In one embodiment the substrate is silanized before step a).

In one embodiment the exposure in the selected pattern is made by applying a mask to the material.

In one embodiment the material is not tacky at the process temperature so that the mask does not stick to the material.

In one embodiment the material contains a solid aromatic epoxy resin with a molecular weight Mw in the interval 900-1500.

In one embodiment the solid epoxy resin is partially acrylated.

In one embodiment the temperature is increased after exposing said material to said actinic radiation. In one embodiment the temperature is increased after contacting the remaining cross-linked polymer network with the second initiator. In one embodiment the temperature does not exceed 42° C. during the process. It is an advantage that the temperature can be kept low to protect temperature sensitive materials. In an embodiment with temperature sensitive materials the temperature should be kept below the limit of the sensitive material during the entire process.

In one embodiment the steps d) and e) are performed in one step and wherein said other object at least partially comprises chemical groups on its surface, which groups act as the second initiator.

In one embodiment the second initiator in step d) is provided in a solution.

In one embodiment the second initiator is provided in the organic solvent of step c).

In one embodiment the second initiator is a base initiator. In one embodiment the second initiator is a base initiator capable of initiating epoxy-thiol reactions and epoxy homopolymerisation. In one embodiment the second initiator is an amino functional hydrolysable silane.

In one embodiment the material and the other object are forced towards each other with a force in step e).

In a second aspect there is provided an object manufactured according to the method.

BRIEF DESCRIPTION OF THE DRAWINGS

The invention is now described, by way of example, with reference to the accompanying drawings, in which.

Figure 1:
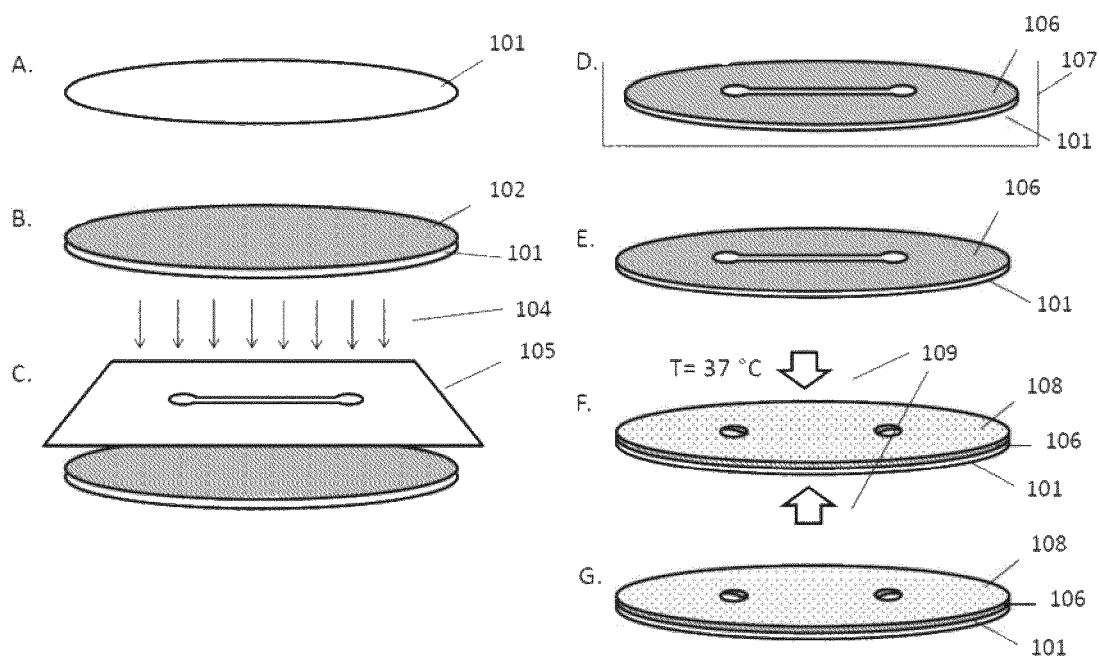
FIG. 1 shows one embodiment where.

A: The substrate, for example a silicon or glass wafer or plate 101.

B: The substrate 101 is spin coated with a layer of the material (formulation A, table 1), 102 dissolved in a suitable solvent and soft baked to remove all solvent and form a solid non-tacky layer.

C: The material 102 is then photo patterned for example using a photomask 105 and actinic radiation 104. This completes the first curing step of the material to form a cross-linked polymer network 106 where exposed to actinic radiation 104.

D: The pattern of cross linked polymer network 106 is developed by immersion in a developer i.e. an organic solvent 107. The organic solvent dissolves and removes material 102 which has not cross linked.

E: After the development the pattern is hard baked to remove all developer i.e. organic solvent 107.

F: A separate glass wafer with machined access ports 108 is coated with a monolayer of an initiator solution, aligned and pressed 109 on the developed pattern of cross linked polymer network 106 using a bonder tool or press at 37° C. at 2 bars for 10 min.

G: The stack is then left to post-cure during 8 hours at RT before dicing.

Figure 2:
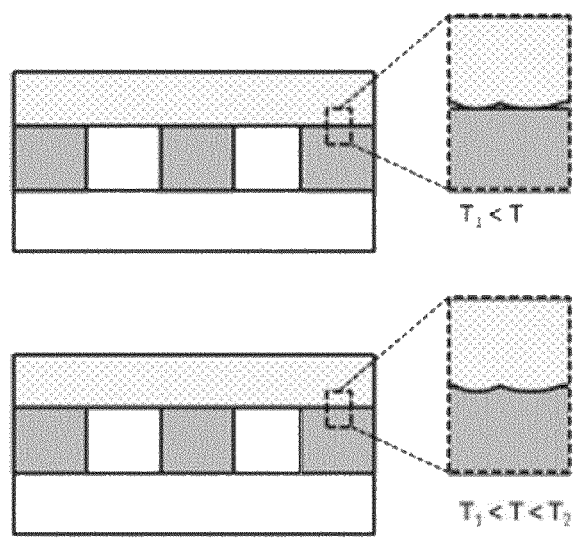
Figure 3:
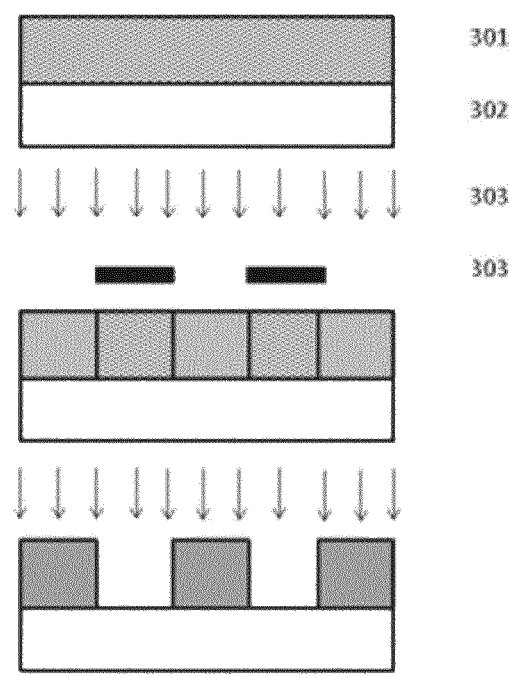

FIG. 2 shows that glass transition for intermediate state enables conformal contact, FIG. 3 shows dual cure with intermediate processing state and final properties.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

As used in the description and the claims the term "article" denotes the resulting object made in the method.

As used in the description and the claims the term "material" denotes the starting material used in the method. It typically comprises several different components.

As used in the description and the claims the term "cross-linked polymer network" denotes matter manufactured from the starting material with a chemical reaction.

As used in the description and the claims the term "activated cross-linked polymer network" denotes a cross-linked polymer network recently contacted with the second initiator so that the reactions still are ongoing. The activated cross-linked polymer network displays adhesive properties at least towards objects to be bonded.

As used in the description and the claims the term "first initiator" denotes an initiator utilized to initiate a reaction in the material upon exposure to actinic radiation.

As used in the description and the claims the term "room temperature" denotes a temperature of 20° C.

As used in the description and the claims the term "second initiator" denotes an initiator utilized to initiate a reaction in the cross-linked polymer network to obtain an activated cross-linked polymer network.

Surprisingly it has been found that it is possible to make a dual cure polymer system with the following characteristics:

An uncured state characterized by thermoplastic properties. The material is an essentially non tacky solid at room temperature but can be dissolved in organic solvents to render it liquid properties.

The material is cross-linkable by exposing it to actinic radiation. This first cure step cross links the material and makes it insoluble in normal organic solvents.

A second cure step is initiated by an external second initiator in a second activation step, resulting in a denser cross link and provides adhesion to surfaces to which the material should be bonded to. This creates a cross-linked polymer network with adhesive properties.

The second initiator can be delivered either in the form of a solution of chemicals that activates the second cure step or the second initiator can also be delivered as a modification of the surface to be bonded, using chemical groups which can activate the second cure step. This is the second activation step.

Such a dual cure material can be used to make three dimensional structures of photolithography patterns.

In one particular embodiment with a film the following steps are performed:

The uncured dual cure polymer system, i.e. the material, is dissolved in an organic solvent to achieve the desired viscosity and dry content.

A film is made on a suitable substrate and the organic solvent is evaporated so that a solid non tacky film of the material is achieved. In an alternative embodiment an object is made entirely of partially of the material directly.

A photolithography pattern mask is applied on the film. This assembly is exposed to actinic radiation suitable for the first cure step. The exposure to actinic radiation is a first activation step to initiate a polymerization reaction in the first cure step. Alternatively actinic radiation is applied without a mask using for instance a laser or another device capable of illuminating desired parts of the material. The exposure creates a cross-linked polymer network.

The photolithography pattern is developed by dissolving the parts of the material which have not been cured by the exposure of actinic radiation, using a suitable organic solvent. This leaves the cross-linked polymer network which is not soluble in the organic solvent.

After the solvent is removed, the second cure step is started by applying the second initiator. In one embodiment this is made by applying a solution of activating chemicals. The surfaces to be bonded have to be assembled before the second cure step has gone to completion. In a second embodiment the surface to be bonded to the lithography pattern has been modified with chemical groups which activate the second cure step in the photo resist material. The application of the second initiator creates an activated cross-linked polymer network.

Regarding the material for the method any material capable of creating a cross-linked polymer network can be used. The term material is used to denote the starting material. Examples include monomers, oligomers and polymers. In one embodiment the material is a polymer. A dual cure polymer system suitable as material for this invention can be made from a ternary system consisting of thiol functional monomers, solid epoxy resin and monomers with carbon-carbon unsaturated bonds. An UV initiator is in one embodiment used for the first cure step were thiols react with the carbon-carbon unsaturations. A base initiator is in one embodiment added to initiate the second cure step. A suitable base will activate both epoxy-thiol crosslinking reactions and epoxy homopolymerisation. The uncured material should preferably be sufficiently solid and non-tacky when there is no solvent present so that it can be applied or made into the correct shape and so that a photo-mask does not stick to the material.

Either an epoxy with carbon-carbon double bond(s) is used in the starting material or alternatively a sufficiently high molecular weight of the epoxy is used for the epoxy molecule to stay in the network formed after the first activation step. The monomers comprising at least two thiol groups, and the monomers comprising at least two carbon-carbon unsaturated bonds together create a very uniform network with a certain mesh size after the first activation step which mesh size allow diffusion of molecules under a certain limit. The network is so homogenous that it will retain molecules with a molecular weight over about 400-600. Thus it is either possible to use epoxy with a molecular weight over about 400-600 or alternatively it is possible to use epoxy molecules with unsaturated bonds. In the latter case the molecular weight can be smaller, but can also be over about 400-600.

The ternary polymer system is in one embodiment dissolved in a suitable solvent to render the system liquid for the process.

In another embodiment of the invention an epoxy resin is partially modified to have unsaturated carbon-carbon groups to be included in the material. This will bond the epoxy resin to the network formed during the first cure step, which will minimize the risk of leaching out the epoxy resin during the solvent development process.

The developer liquid or organic solvent can be any organic solvent capable of dissolving solid epoxy resins and having a suitable evaporation rate.

The second initiator for the second cure step can be any effective agent that promotes crosslinking or homoplymerisation of epoxy groups so that an activated cross-linked polymer network is formed. The term activated indicates that the reaction is ongoing so that bond with another object can be formed. The second initiator is in one embodiment dissolved in a suitable solvent at a suitable concentration depending on the type of initiator. An amino functional hydrolysable silane is in one embodiment a second initiator since it has the advantages to contribute to adhesion and cross linking density.

In another embodiment the developer liquid and initiator liquid are combined into one liquid. Then the dissolution of the uncured material and the activation of the cured material (i.e. the cross linked polymer created) is performed in one step.

In yet another embodiment the surface to be bonded to the photo resist pattern is modified to have chemical groups which will initiate epoxy thiol reactions and epoxy homopolymerisation. Then the contacting with the initiator and the objects to be bonded is performed in one step.

If necessary the substrate is prepared by cleaning and application of a suitable primer.

In one embodiment the dissolved ternary polymer system, i.e. the material is shaped to a uniform film on the used substrate, preferably using a spin on method.

The material should preferably be protected against UV rays until the pattern mask is applied to protect it from unintentional curing.

After the material is formed, the solvent is in one embodiment evaporated using mild heating or vacuum. If heat is used, the film should be allowed to cool to room temperature.

In one embodiment a pattern mask is placed on top of the film and this assembly is exposed to actinic radiation through the mask. The mask is removed and the polymer film is rinsed with the developer liquid.

In an alternative embodiment the material is exposed to actinic radiation using a laser or another source capable or irradiating selected parts to create a pattern without the need of a mask.

In one embodiment of the invention, the irradiated material is rinsed with an organic solvent comprising the second initiator, which then also dissolves the uncured material. If a combined developer and initiator liquid is used, the irradiated material is rinsed with this combination.

In another embodiment, the developed resist pattern is directly bonded with an initiator-modified surface. The surface of the other object then comprises chemical groups acting as a second initiator.

Epoxy resins useful for the invention should be solid at room temperature. Preferably the softening point should be 60° C. or higher to make the finished resist compound non sticky after solvent evaporation to enable contact lithography. The molecular weight needed to achieve this varies with the molecular structure of the resin, but in the case of most aromatic epoxy resins the limit is approximately Mw 1000. The epoxy resin must have functionality above one and preferably two or more. Epoxy resins suitable for the invention include but are not limited to: Diglycidylethers of bisphenol A, Diglycidylethers of bisphenol F, di- or polyglycidylethers of phenolic novolac resins, di- or polyglycidyl ethers of cresol novolac resins and mixtures or co-polymers of the mentioned epoxy resins.

In order to provide a suitable material a modification of the epoxy resin should be done so that the resins have unsaturated groups which are possible to react with thiols in the thiol-ene reaction to avoid extraction of the epoxy resin during the development operation. The modification must be only partial to leave epoxy groups for the second cure reaction. Suitable groups include but are not limited to: allyl, acrylates, methacrylates, vinyl groups or diene- or isoprene-monomers.

Suitable monomers to partially modify the epoxy resin suitable for the invention include but are not limited to: Acrylic acid, methacrylic acid, hydroxyl ethyl acrylate, hydroxyl ethyl methacrylate, allyl alcohol, allyl chloride, carboxyl terminated diene oligomers or polymers.

Suitable solvents for the polymer system should have solvency parameters adapted to the resins and monomers used to achieve a low viscosity mixture which does not risk precipitating. The evaporation rate is also a critical factor when a film is created and which will affect spinning properties and bake temperature and time. Solvents suitable for the polymer system include but are not limited to: acetone, ethyl acetate, butyl acetate, cyclopentanone, cyclohexanone, propylene glycol monomethyl ether acetate, propylene carbonate, ethylene carbonate, tetrahydrofuran and dimethylsulfoxide.

Suitable solvents for the developer, i.e. organic solvent should be able to dissolve the unexposed areas of the resist film without causing excessive swelling of the exposed areas of the resist film. Solvents suitable for the development process include but are not limited to: Acetone, Ethyl acetate, butyl acetate, cyclopentanone, cyclohexanone, propylene glycol monomethyl ether (acetate), dipropylene glycol monomethyl ether (acetate) and isopropyl alcohol.

The organic solvents can be the same or different. Mixtures of organic solvents are also encompassed.

Second initiators suitable for the second cure step should be able to react with epoxy groups, glycidyl ether groups or hydroxyls and thus form a tight network. A person skilled in epoxy chemistry will have the knowledge to select suitable initiators. Such initiators include but are not limited to:

Nucleophiles that undergo step growth reactions with the epoxy groups: Primary and secondary amines, thiols, carboxylic acids, and phenols.

Catalytic species that promote anionic chain growth reactions of the epoxy groups: Tertiary amines, imidazoles, and pyridine.

Species that copolymerize with the epoxy groups: Cyclic anhydrides.

Species that crosslink through the hydroxyl groups: Isocyanates, amino-formaldehyde resins.

For the embodiment of the invention where the second cure step is activated by functional groups on the surface to be adhered to, substances are needed which can be used to modify such a surface to enable activation of the thiol-epoxy cure of the second cure step. The substance also needs to have a second functionality to bond it to a surface. Such activating substances include but are not limited to: gamma-aminopropyltriethoxysilane, gamma-aminopropyltrimethoxysilane, N-beta-(aminoethyl)-gamma-aminopropyltrimethoxysilane, N-beta-(aminoethyl)-gammaaminopropyltriethoxysilane, triaminotrimethoxy silane, gamma-mercaptopropyltrimethoxysilane, gamma-mercaptopropyltriethoxysilane In one embodiment the compound comprising at least two thiol groups is selected from the group consisting of pentaerythritol tetrakis (2-mercaptoacetate), pentaerythritol tetramercaptopropionate (PETMP); 1-octanethiol; butyl 3-mercaptopropionate; 2,4,6-trioxo-1,3,5-triazina-triy (triethyl-tris (3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, and trimethylolpropane tris(3-mercaptopropionate), and glycol dimercaptopropionate and pentaerythritol tetramercaptopropionate (PETMP)

In one embodiment the compound comprising at least two carbon-carbon double bonds is selected from the group consisting of triallyl-1,3,5-triazine-2,4,6(1H,3H,5H)-trione; tetra allyloxy ethane (TAE); triethyleneglycol divinyl ether (TEGDVE); trimethylolpropane diallyl ether; 1,6-heptadiyne; 1,7-octadiyne; bis-2,2-[4-(2-[norborn-2-ene-5-carboxylate]ethoxy)phenyl]propane (BPAEDN); 1,6-hexanediol di-(endo,exo-norborn-2-ene-5-carboxylate) (HDDN); trimethylolpropane tri-(norborn-2-ene-5-carboxylate) (TMPTN); pentaerythritoltri-(norborn-2-ene-5-carboxylate) (PTN3); pentaerythritol tetra-(norborn-2-ene-5-carboxylate) (PTN4); tricyclodecane dimethanol di-(endo, exo-norborn-2-ene-5-carboxylate) (TCDMDN); and di(trimethylolpropane) tetra-(norborn-2-ene-5-carboxylate) (DTMPTN).

All the described alternative embodiments above or parts of an embodiment can be freely combined without departing from the inventive idea as long as the combination is not contradictory.

Other features and uses of the invention and their associated advantages will be evident to a person skilled in the art upon reading the description and the examples.

It is to be understood that this invention is not limited to the particular embodiments shown here. The embodiments are provided for illustrative purposes and are not intended to limit the scope of the invention since the scope of the present invention is limited only by the appended claims and equivalents thereof.

EXAMPLES

Materials Used
Pentaerythritol tetrakis(3-mercaptopropionate) (PETMP) from Sigma-Aldrich
TPOL (Ethyl (2,4,6-trimethylbenzoyl) phenylphosphinate)
Bis(2,4,6-trimethylbenzoyl)-phenylphosphineoxide (Irgacure 819 from BASF)
Triallylisocyanurate. Mw 249,27, functionality 3 (TAIC)
Epon 1002F, a glycidyl ether of bisphenol A from Momentive. Mw approximately 1300, epoxy equivalent weight 600-700 and softening point 85° C.
Epon 1002F, 45% of the epoxy groups modified with acrylic acid. (E45)
SU8 epoxy resin from Hexion
SU8, 20% of the epoxy groups modified with acrylic acid "SU8-20"
Q1301 Nitorosophenylhydroxylamine aluminum salt (Wako)
Ethyl Lactate
The acrylation of Epon 1002F and SU8 was performed by Ramidus AB.
Dynasylan MTMO, Y-mercaptotrimethoxy silane, from Evonik
Dynasylan AMMO, Y-aminotrimethoxy silane, from Evonik
N-(2-aminoethyl)-N'-[3-(trimethoxysilyl)prop yl]ethylenediamine, Silquest A 1130 from Momentive
DBN, 1,5-Diazabicyclo[4.3.0]non-5-ene
Propylene glycol methylether acetate (PMA)
Methanol (MeOH)
Butyl acetate (BuAc)

Preparation of polymer blend

The respective ingredients were weighed in a glass vial and mixed on a lab vortex vibration blender and/or with a spatula.

Priming

All silicon wafer surfaces were silanized using a 1% solution of Dynasylan AMMO in methanol. The solution was spun at 2000 rpm and baked on a hot plate at 85 C for 5 minutes.

Glass Slides did not need priming and the surface preparation involved standard cleaning with Acetone and Isopropanol.

Activation of Glass Surfaces

Glass wafers which should be used to induce the second cure step were activated the following way. A solution of 0.7% MTMO and 0.3% Silquest A 1130 in methanol was prepared. This solution was spun on the glass wafer at 2000 rpm and baked on a hot plate at 85 C for 5 minutes.

Resist Formulations

TABLE 1

|  | A (g) | B (g) | C (g) | D (g) |
|---|---|---|---|---|
| PETMP | 10 | 10 | 1.43 | 1.49 |
| Irgacure 819 | 4 |  | 0.147 | 0.12 |
| TPOL |  | 0.64 |  |  |
| TAIC | 4.95 | 2.70 | 1.03 | 0.55 |
| TAE |  | 1.74 |  |  |
| SU8 |  |  | 5.9 |  |
| SU8-20 |  |  |  | 4.78 |
| E45 | 45 | 24.80 |  |  |
| BuAc | 48.13 |  |  |  |
| Cyclohexanone |  | 23.51 | 1.47 | 0.12 |
| Q1301 |  |  | 0.006 | 0.003 |

Example A

Resist formulation A (table 1) was spun on a primed (1% aminosilane in methanol) 4 inch silicon wafer at 1000 rpm. The wafer was soft baked on a hot plate at 85° C. for 5 min and was subsequently left to cool to RT. At this stage the resist surface was dry to the touch. A UV cured pattern was produced by irradiating the resist film through a photomask in a mask aligner machine (SUSS Microtec MA6) using a standard medium pressure mercury lamp. The exposure dose was 500 mJ/cm2. The mask did not stick to the resist surface after removal from the resist machine. The UV cured pattern was developed using DPMA. The wafer was hard baked at 80° C. for 5 min on a hotplate. This temperature can in other embodiments be lower when temperature sensitive molecules are present. The wafer was examined in a microscope. The pattern from the glass mask was reproduced with a very good resolution. The thickness was measured to 12 μm.

The bonding of a cap was accomplished using two different methods.

In the first bonding method a second initiator solution (10% Silquest A 1130 and 0.1% DBN in methanol) was applied on the resist surface. The activated wafer was then bonded to a clean glass wafer in a bonder (SUSS Microtec BA6) at 37° C. and 2 bar during 10 min. The wafer stack was then removed from the bonder and let to post-cure at room temperature for 12 hrs before being diced into chips using a dicing saw (DISCO). The chips were inspected under microscope. The bonding area was homogeneous and the pattern unchanged. No leakage between the channels was observed after they were filled with a fluorescent dye.

In the second bonding method a clean glass wafer was first primed with a solution of 0.33% amino- and 0.66% mercaptosilane in methoanol. The primed side of the glass wafer was then aligned and put into contact with the patterned resist on the wafer. The stack was then bonded in a bonder (SUSS Microtec BA6) at 37° C. and 2 bar during 10 min. The wafer stack was then removed from the bonder and let to post-cure at room temperature for 12 hrs before being diced into chips using a dicing saw (DISCO). The chips were inspected under microscope. The bonding area was homogeneous and the pattern unchanged. No leakage between the channels was observed after they were filled with a fluorescent dye.

Example B

Resist formulation A (table 1) was spun on clean glass wafers (Borofloat) at 500 rpm. The wafer was soft baked on a hot plate at 85° C. for 5 min and subsequently left to cool to RT. In other embodiments this temperature is lower if a temperature sensitive molecule is present. At this stage the resist surface was dry to the touch. A UV cured pattern was produced by irradiating the resist film through a photomask in a mask aligner machine (SUSS Microtec MA6) using a standard medium pressure mercury lamp. The exposure dose was 1000 mJ/cm2. The mask did not stick to the resist surface after removal from the resist machine. The UV cured pattern was developed using DPMA. The wafer was hard baked at 85° C. for 5 min on a hotplate. In other embodiments this temperature is also lower if a temperature sensitive molecule is present. The wafer was examined in a microscope. The pattern from the glass mask was reproduced with a very good resolution.

A second clean glass wafer was then primed with a solution of 0.33% amino- and 0.66% mercaptosilane in methanol. The primed side of the glass wafer was then aligned and put into contact with the patterned resist on the first glass wafer. The stack was then bonded in a bonder (SUSS Microtec BA6) at 37° C. and 2 bar during 10 min. The wafer stack was then removed from the bonder and let to post-cure at room temperature for 12 hrs before being diced into chips using a dicing saw (DISCO). The chips were inspected under microscope. The bonding area was homogeneous and the pattern unchanged. No leakage between the channels was observed after they were filled with a fluorescent dye.

Example C

Resist formulation B (table 1) was spun on a silicon wafer. Spin speed was 1000 rpm and acceleration 3000rpm/s. A very smooth film was obtained. The wafer and film was soft baked at 90° C. for 7 minutes on a hot plate. In other embodiments this temperature is lower if a temperature sensitive molecule is present. After cooling to ambient temperature, a smooth film without tackiness was at hand.

The film was exposed through a patterned mask with 365 nm LED light 1.5 W for 8 seconds. Post exposure bake was made in a 60° C. oven for 3 minutes. In other embodiments this temperature is lower if a temperature sensitive molecule is present.

The pattern was developed using DPMA for 8 minutes and then very briefly rinsed with acetone. A slight swelling of the film could be observed during the development process.

Residual solvent was driven away using a hot plate at 110° C. for 3 minutes.

In other embodiments this temperature is lower if a temperature sensitive molecule is present.

The second cure step activation and bonding process was in the same way as in the first bonding method in example A No leakage between the channels was observed after they were filled with a fluorescent dye.

Example D

Resist formulation C (table 2) was spun on a glass slide at 3000 rpm. The glass slide was soft baked on a hot plate 3 minutes at 65° C., then 7 minutes at 95° C. and was subsequently left to cool to RT. At this stage the resist surface was dry to the touch.

The loss in weight corresponding to the evaporation of substrate was measured during the softback process, finding a plateau after 10 mines.

A UV cured pattern was produced by irradiating the resist film through a photomask under a 365 nm UV lamp. The exposure dose was 1000 mJ/cm2. The mask did not stick to the resist surface after removal from the glass slide. A post exposure bake process was performed at 65° C. for 5 minutes. The UV cured pattern was developed using Ethyl Lactate. The wafer was hard baked at 80° C. for 5 min on a hotplate. The wafer was examined in a microscope. The pattern from the glass mask was reproduced with a very good resolution. The thickness was measured to 20 µm.

The bonding of a cap was accomplished using two different activation methods:

In the first method a second clean glass slide was primed with a solution of 0.33% A1130 and 0.66% MTMO in methanol and baked 5 minutes at 95° C. on a hotplate.

In the second method the first glass slide with the patterned photoresist was primed with the same solution.

After cooling it down to room temperature, both glass slides were joined together manually and placed in between the hotplates of a hot press. The plates were set to 41° C. and loaded with a 5 Kgs Weight. 10 minutes later the weight and plates were removed and the bonded glass slides stack was inspected under a microscope. The bonding area was homogeneous and the pattern unchanged. No leakage between the channels was observed after they were filled with Deionized water.

The bonding could be reversed by heating the glass slides over 50° C. and pulling out the substrates.

An additional experiment comparing an activated vs non activated glass lid, showed that when pulling out the substrates, only few spots of resin remain on the non activated lid, while it evenly distributes in the activated lid case.

Example E

Resist formulation D (table 2) was spun on a glass slide at between 1500-3000 rpm. The glass slide was soft baked on a hot plate 5 minutes at 80° C., and was subsequently left to cool to RT. At this stage the resist surface was dry to the touch. A UV cured pattern was produced by irradiating the resist film through a photomask under a 365 nm UV lamp. The exposure dose was 1000 mJ/cm2. The mask did not stick to the resist surface after removal from the resist machine. A post exposure bake process was performed at 65° C. for 3 minutes. The UV cured pattern was developed using Ethyl Lactate. The wafer was hard baked at 80° C. for 5 min on a hotplate. The wafer was examined in a microscope. The pattern from the glass mask was reproduced with a very good resolution. The thickness was measured between 15-30 μm.

For bonding a second clean glass slide was primed with a solution of 0.33% A1130 and 0.66% MTMO in methanol and baked 5 minutes at 95° C. on a hotplate. After cooling it down to room temperature, both glass slides were joined together manually and placed in between the hotplates of a hot press. The plates were set to 41° C. and loaded with a 5 Kgs Weight. 10 minutes later the weight and plates were removed and the bonded glass slides stack was inspected under a microscope. The bonding area was homogeneous and the pattern unchanged. No leakage between the channels was observed after they were filled with deionized water.

The invention claimed is:

1. A method for manufacturing an article comprising the steps of:
    a) providing a material which is solid at room temperature, wherein said material is soluble in an organic solvent, wherein the material comprises at least one selected from the group consisting of i) an epoxy resin with unsaturated carbon-carbon bonds and ii) an epoxy resin with a molecular weight over 400, wherein the material comprises monomers comprising at least two thiol groups, monomers comprising at least two carbon-carbon unsaturated bonds, and a first initiator capable of initiating a chemical reaction to form a cross-linked polymer network when the material is exposed to actinic radiation in a first activation step and wherein said material can undergo the chemical reaction to form a cross-linked polymer network when the material is exposed to actinic radiation in the first activation step,
    b) at least partially exposing said material to actinic radiation adapted to initiate the chemical reaction to form a cross-linked polymer network in the first activation step, wherein said exposure is made in a pattern, wherein the cross-linked polymer network is not soluble in the organic solvent,
    c) dissolving non-cross-linked portions of said material in an organic solvent so that the cross-linked polymer network remains,
    d) contacting the cross-linked polymer network with a second initiator in a second activation step to initiate a further reaction to create further cross links and adhesive properties to obtain an activated cross-linked polymer network,
    e) contacting the activated cross-linked polymer network with an object so that they become bonded forming the article.

2. The method according to claim 1, wherein the material is applied on a substrate as a film.

3. The method according to claim 2, wherein the substrate is treated with a primer before step a).

4. The method according to claim 3, wherein the substrate is silanized before step a).

5. The method according to claim 1, wherein the material in step a) first is dissolved in an organic solvent, and wherein said organic solvent subsequently is evaporated before step b).

6. The method according to claim 5, wherein the organic solvent is evaporated using at least one selected from the group consisting of vacuum and heat.

7. The method according to claim 1, wherein the exposure in the selected pattern is made by applying a mask to the material.

8. The method according to claim 7, wherein the material is not tacky so that the mask does not stick to the material.

9. The method according to claim 1, wherein the material comprises a polymer.

10. The method according to claim 1, wherein the first initiator is an UV initiator.

11. The method according to claim 1, wherein the material contains an aromatic epoxy resin with a molecular weight Mw in the interval 900-1500, the molecular weight measured before the first activation step and before the second activation step.

12. The method according to claim 1, wherein a temperature of the material is increased after exposing said material to said actinic radiation.

13. The method according to claim 1, wherein a temperature of the remaining cross-linked polymer network is increased after contacting the remaining cross-linked polymer network with the second initiator.

14. The method according to claim 1, wherein a temperature does not exceed 42° C. during the method.

15. The method according to claim 1, wherein the second initiator in step d) is provided in a solution.

16. The method according to claim 1, wherein the second initiator is provided in the organic solvent of step c).

17. The method according to claim 1, wherein the second initiator is a base initiator.

18. The method according to claim 1, wherein the second initiator is a base initiator capable of initiating epoxy-thiol reactions and epoxy homopolymerisation.

19. The method according to claim 1, wherein the second initiator is an amino functional hydrolysable silane.

20. The method according to claim 1, wherein the material and the object are forced towards each other with a force in step e).

21. The method of claim 1, wherein the epoxy resin (ii) has a molecular weight of over 600.

22. An object manufactured according to claim 1.

23. A method for manufacturing an article comprising the steps of:
    a) providing a material which is solid at room temperature, wherein said material is soluble in an organic solvent, wherein the material comprises at least one selected from the group consisting of i) an epoxy resin with unsaturated carbon-carbon bonds and ii) an epoxy resin with a molecular weight over 400, wherein the material comprises monomers comprising at least two thiol groups, monomers comprising at least two carbon-carbon unsaturated bonds, and a first initiator capable of initiating a chemical reaction to form a cross-linked polymer network when the material is exposed to actinic radiation in a first activation step and wherein said material can undergo the chemical reaction to form a cross-linked polymer network when the material is exposed to actinic radiation in the first activation step,
    b) at least partially exposing said material to actinic radiation adapted to initiate the chemical reaction to form a cross-linked polymer network in the first activation step, wherein said exposure is made in a pattern, wherein the cross-linked polymer network is not soluble in the organic solvent, c) dissolving non-cross-linked portions of said material in an organic solvent so that the cross-linked polymer network remains, d) contacting the cross-linked polymer network with an object including chemical groups that act as a second initiator in a second activation step to initiate a further reaction to create further cross links and adhesive properties in the cross-linked polymer network and obtain an activated cross-linked polymer network which bonds to the object to form the article.

* * * * *